United States Patent [19]
Salet et al.

[11] Patent Number: 6,137,625
[45] Date of Patent: Oct. 24, 2000

[54] SEMICONDUCTOR OPTICAL AMPLIFIER AND INTEGRATED LASER SOURCE INFORMATION

[75] Inventors: Paul Salet, Clamart; Franck Gerard, Montigny le Bretonneux, both of France

[73] Assignee: Alcatel, Paris, France

[21] Appl. No.: 09/188,222

[22] Filed: Nov. 9, 1998

[30] Foreign Application Priority Data

Nov. 10, 1997 [FR] France .................................. 97 14101

[51] Int. Cl.⁷ .................................................. H01S 3/063
[52] U.S. Cl. ............................ 359/344; 385/50; 372/50
[58] Field of Search .............................. 359/344; 372/50; 385/43, 33, 49, 50

[56] References Cited

U.S. PATENT DOCUMENTS

| | | |
|---|---|---|
| 4,815,084 | 3/1989 | Scifres et al. . |
| 4,945,315 | 7/1990 | Shinada .................................... 330/4.3 |
| 5,136,598 | 8/1992 | Weller et al. ............................. 372/26 |
| 5,349,602 | 9/1994 | Mehuys et al. ........................... 372/98 |
| 5,457,569 | 10/1995 | Liou et al. ............................... 359/344 |
| 5,539,571 | 7/1996 | Welch et al. . |
| 5,864,574 | 1/1999 | Welch et al. .............................. 372/50 |

FOREIGN PATENT DOCUMENTS

WO 96/09668  3/1996  WIPO .

OTHER PUBLICATIONS

J. Verdiell et al, "A WDM Receiver Photonic Integrated Circuit with Net on–Chip Gain", IEEE Photonics Technology Letters, vol. 6, No. 8, Aug. 1, 1994, pp. 960–962.

K–Y Liou et al, "High–Power Broad–Area Tapered Amplifier with a Monolithically Integrated Output Focusing Lens at 0.98–um Wavelength", IEEE Journal of Selected Topics in Quantum Electronics, vol. 1, No. 2, Jun. 1, 199, pp. 165–172.

J. P. Donnelly et al, High–Power 1.3–Mum INGAASP–INP Amplifiers with Tapered gain Regions, IEEE Photonics Technology Letters, vol. 8, No. 11, Nov. 1996, pp. 1450–1452.

*Primary Examiner*—Mark Hellner
*Attorney, Agent, or Firm*—Sughrue, Mion, Zinn, Macpeak & Seas, PLLC

[57] ABSTRACT

To avoid the phenomena of self-focusing and astigmatism of the amplified wave, the amplifier includes in succession: an input segment having an input waveguide adapted to guide a monomode input wave; a diffraction segment comprising a first medium transparent to said monomode input wave and adapted to widen it; a collimation segment; and an amplification segment having an amplifier waveguide wider than said input waveguide. The amplifier can provide a high-power laser source supplying a widened fundamental mode wave. Application to producing waves for pumping fiber optic amplifiers.

7 Claims, 5 Drawing Sheets

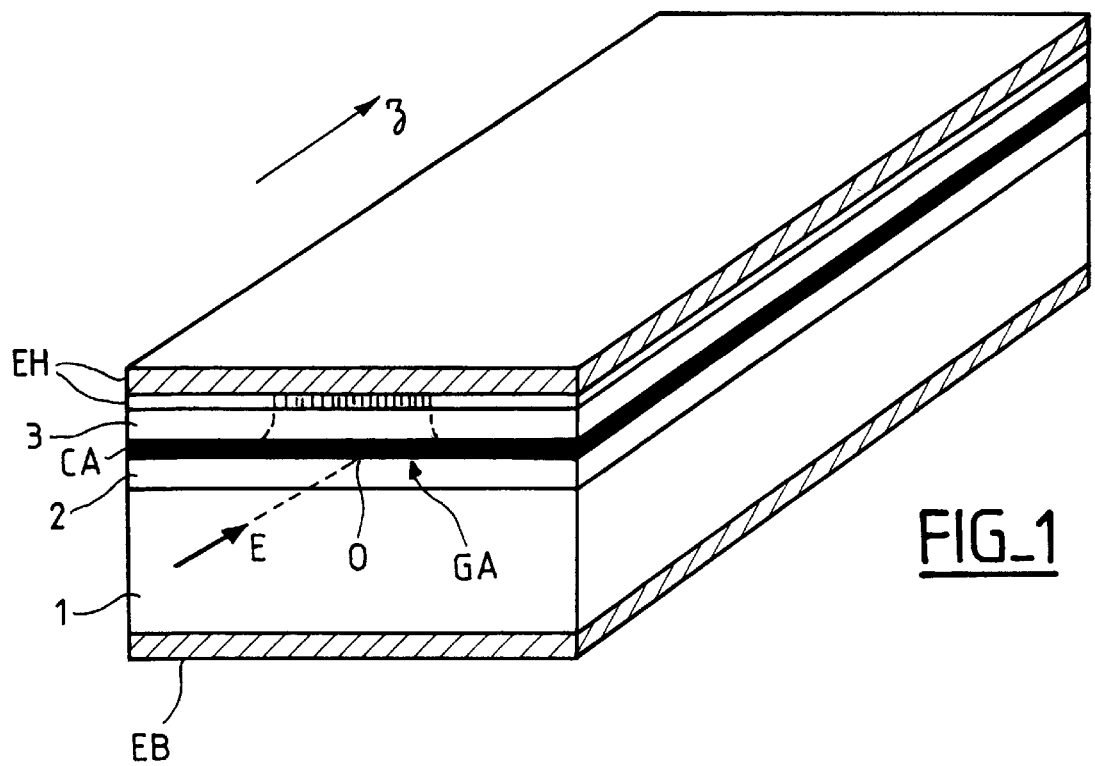
FIG_1
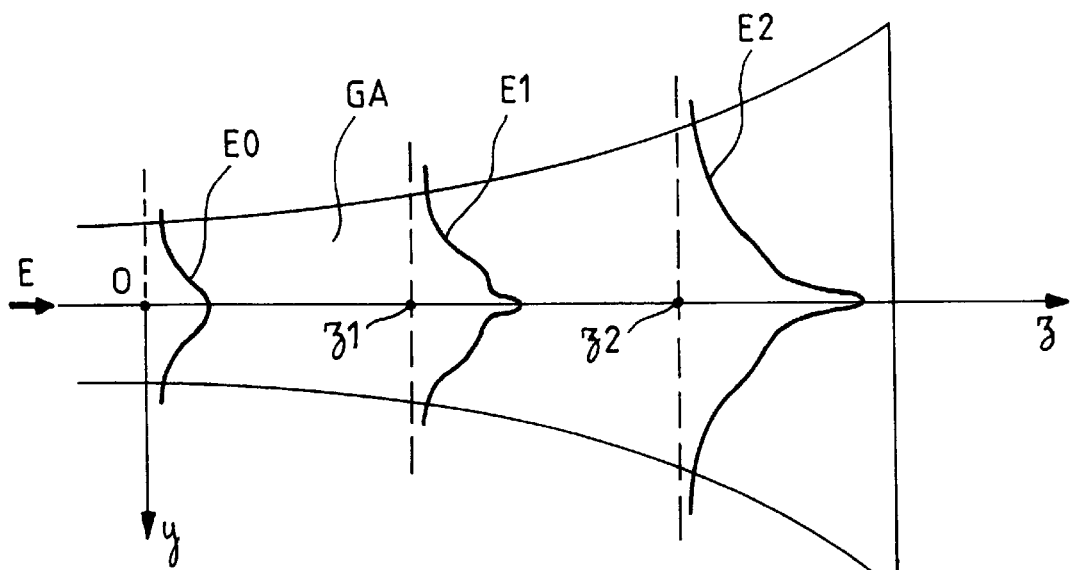
FIG_2

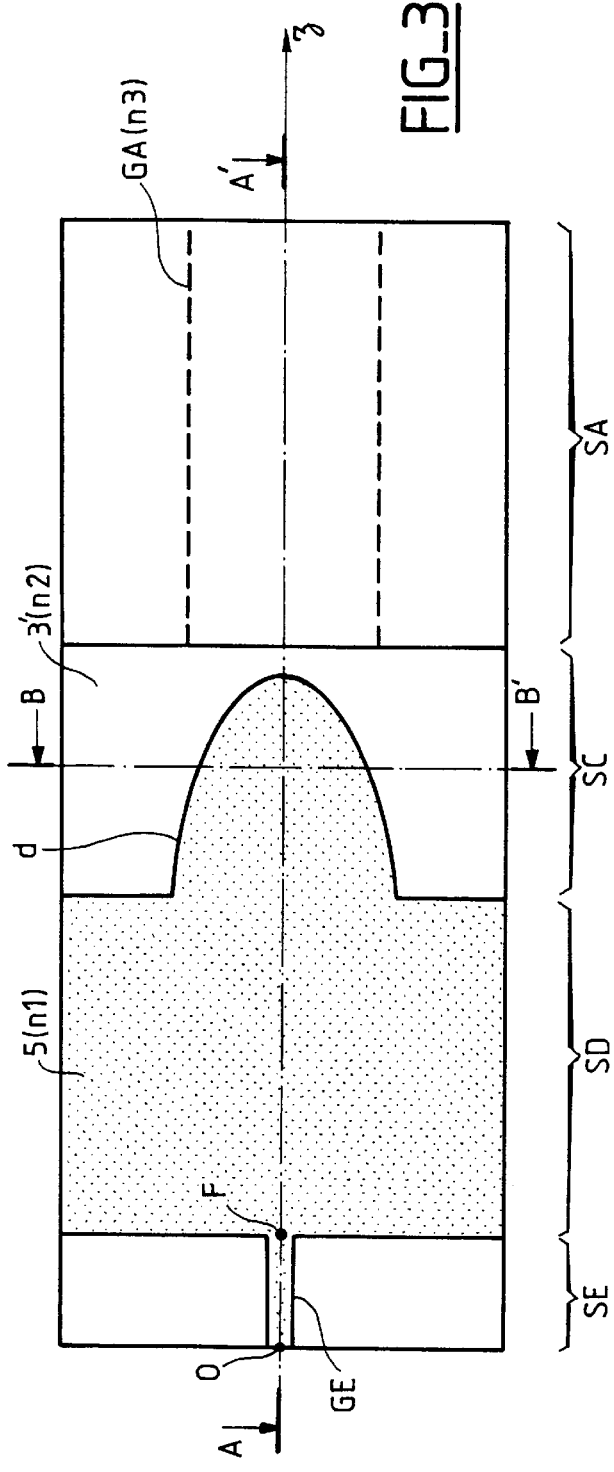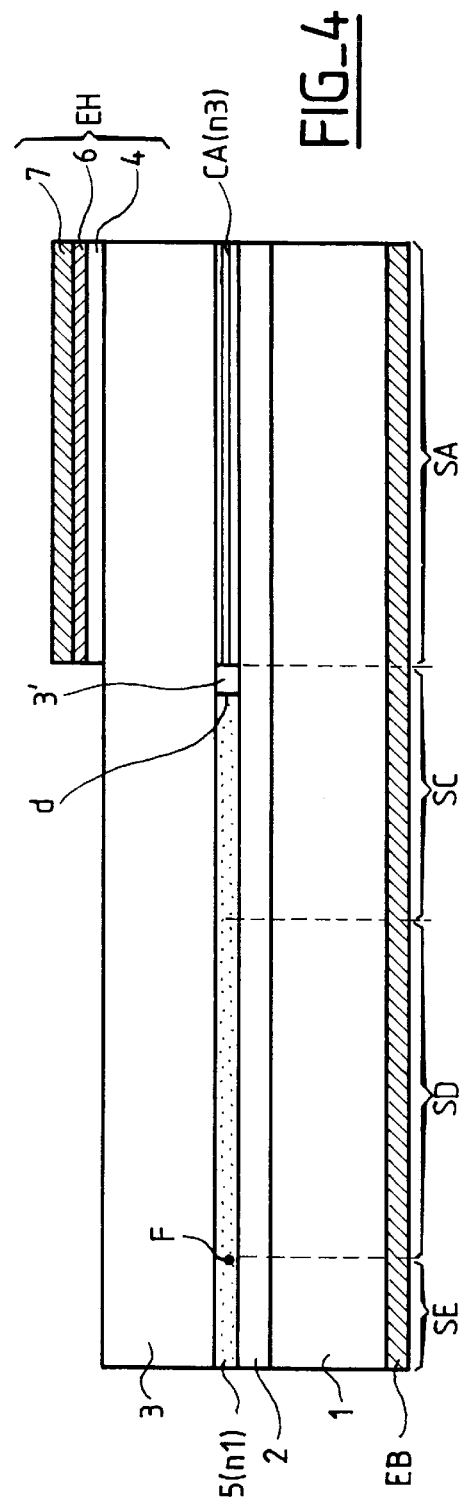

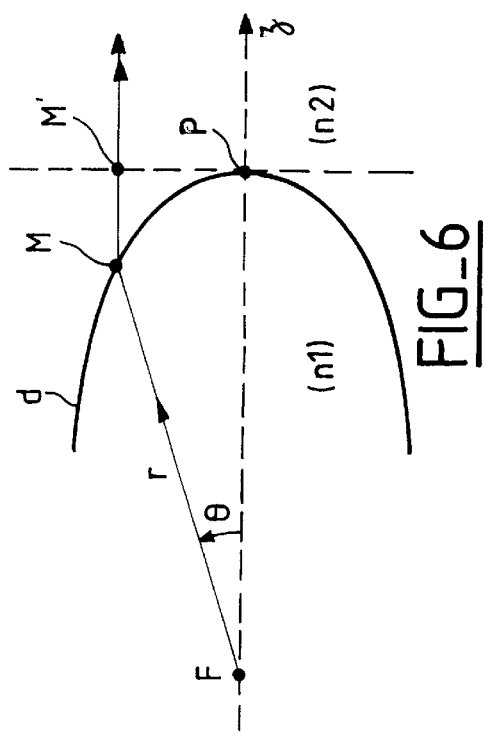
FIG_6
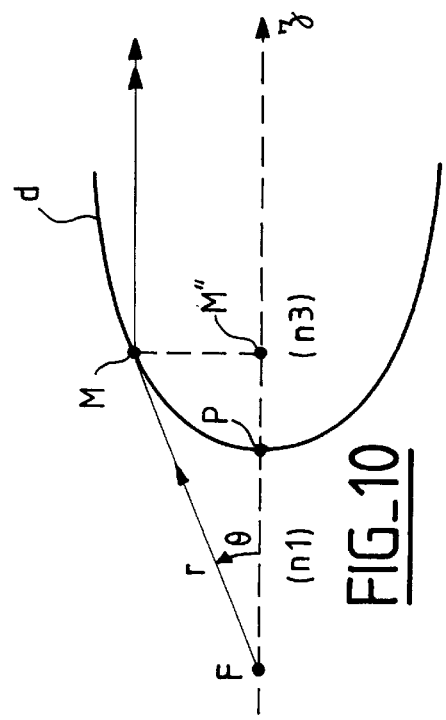
FIG_10
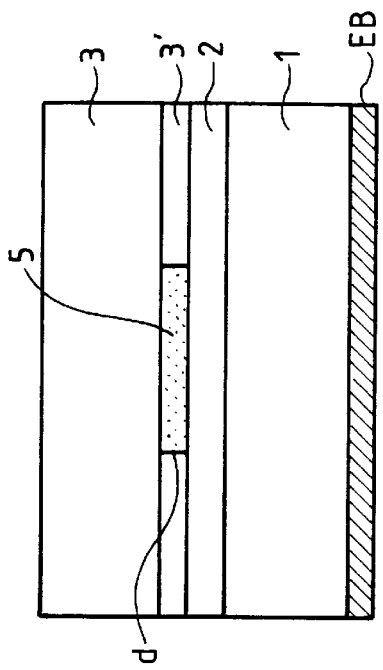
FIG_5
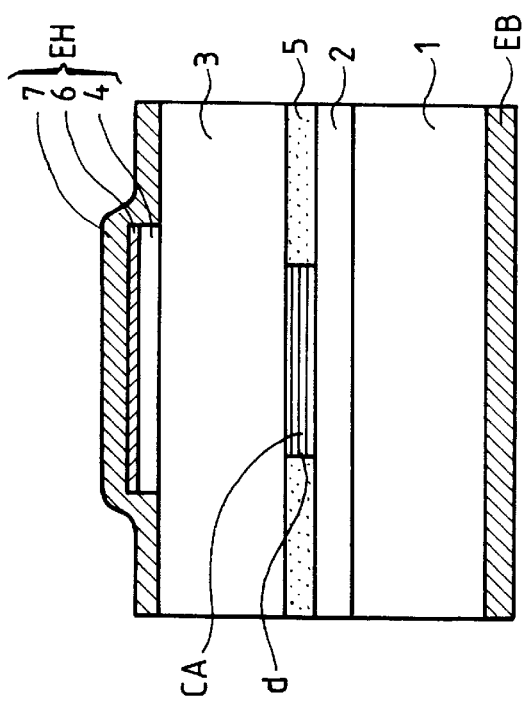
FIG_9

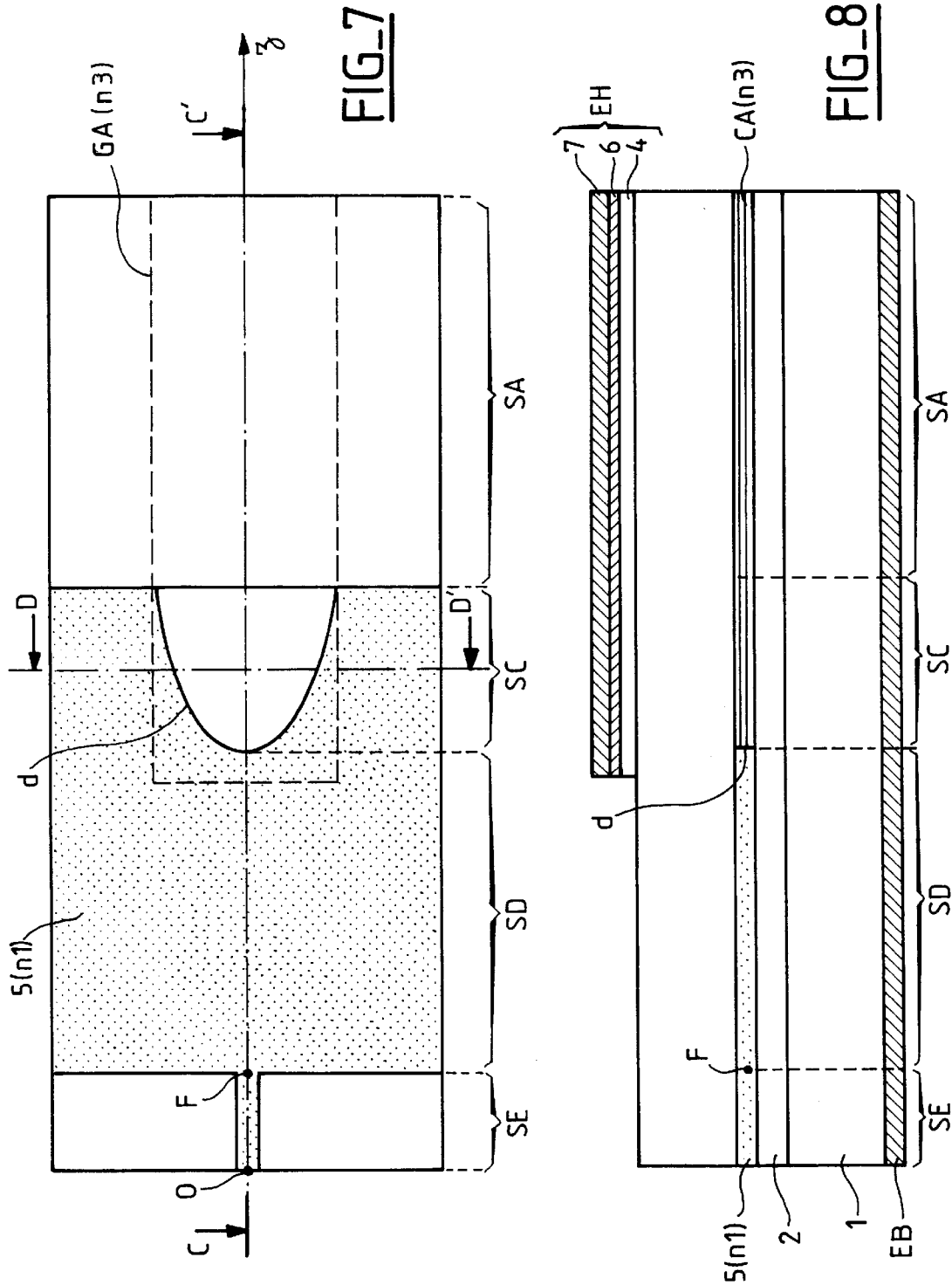

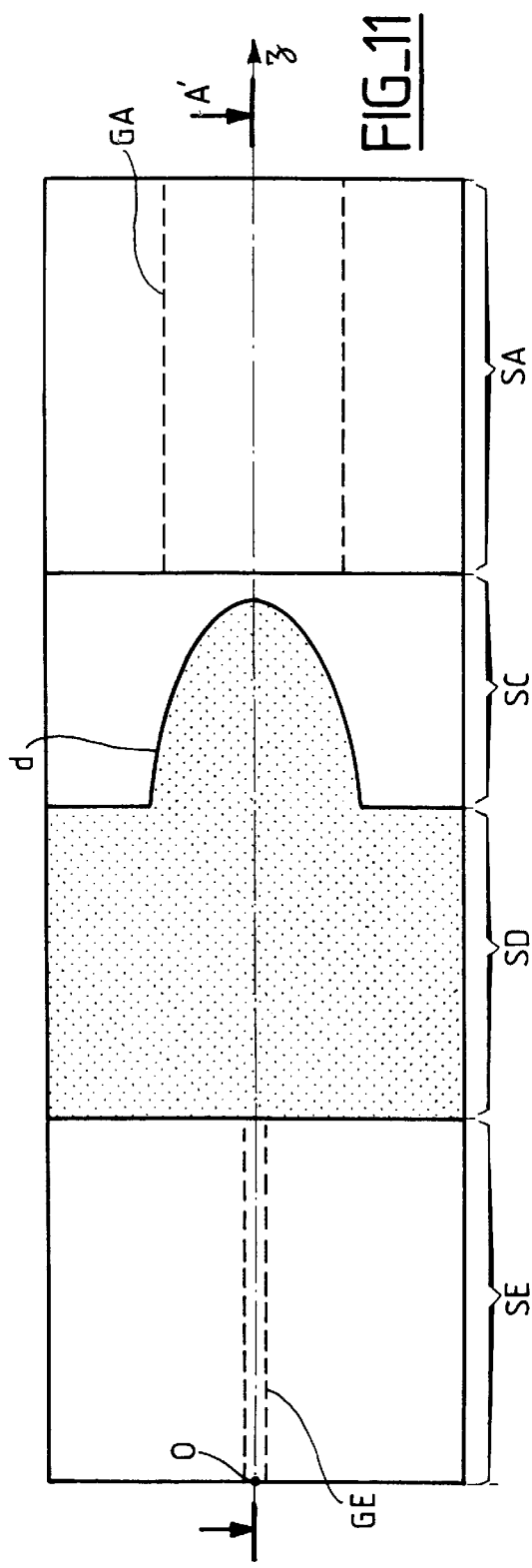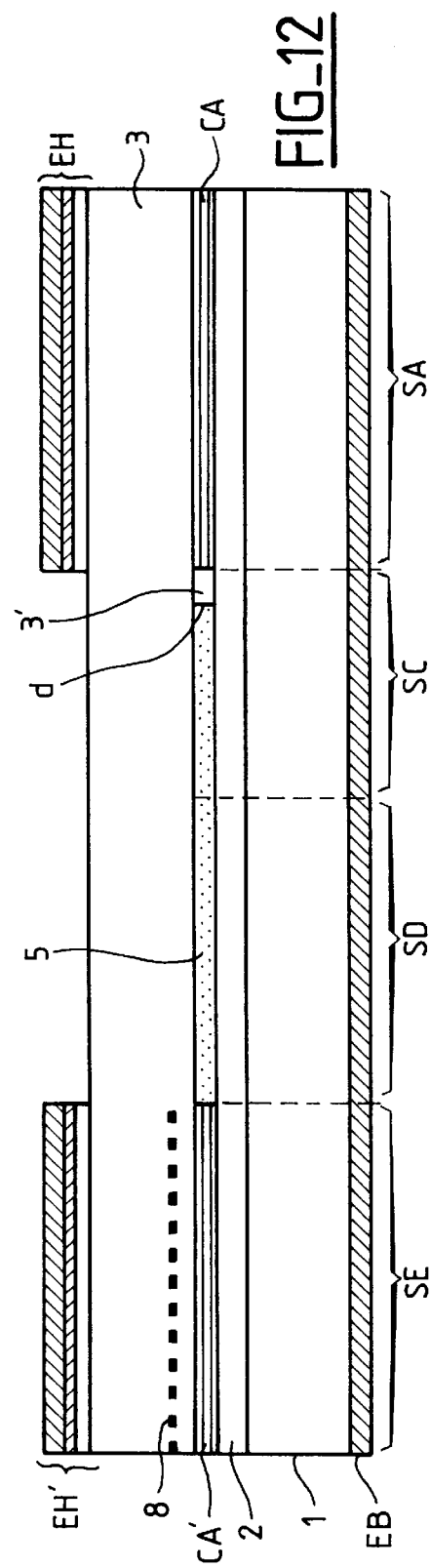

SEMICONDUCTOR OPTICAL AMPLIFIER AND INTEGRATED LASER SOURCE INFORMATION

The invention is in the field of semiconductor optical components and is more particularly concerned with amplifiers and laser sources having a high continuous optical power output.

BACKGROUND OF THE INVENTION

Components of the above type are used to produce waves for pumping fiber optic amplifiers, such as those doped with erbium (EDFA).

For the above application in particular it is necessary to increase the gain of the semiconductor amplifiers and the optical power that they are capable of supplying.

FIG. 1 shows an example of a conventional semiconductor optical amplifier. It essentially comprises an active layer CA confined between a bottom buffer layer 2 and a top buffer layer 3. Biased bottom and top electrodes EB and EH inject a transverse pumping current through the active layer CA.

The region of the active layer within which the optical power is confined is called the amplifier waveguide (or the active waveguide). This region is defined by the vertical structure of the component. The structure can be of the graded index waveguide type. The active layer is then delimited laterally to define the width of the waveguide. The structure can instead be of the gain guided type. In this case the active layer is wider than the waveguide and the width of the waveguide is defined by the shape of the electrodes that localize the injected current, as in the example shown in FIG. 1.

Gain can be increased by lengthening the active waveguide of the amplifier, but this solution is limited by the phenomenon of the gain of the semiconductor amplifier medium saturating.

Gain depends on the length L of the active waveguide and on its gain coefficient g (also known as the "material gain") of the amplifier medium. The coefficient q is defined by:

$dP/dz = g \cdot P$, where z is the position of a point along the longitudinal axis Oz of the amplifier medium and P is the optical power density at that point.

The gain G of the active waveguide (defined here as the ratio of the power densities at the output and at the input of the waveguide) therefore satisfies the equation:

$G = \int g \cdot dz$, the integral being calculated along the longitudinal axis Oz between the input (z=0) and the output (z=L) of the waveguide.

The effect of the gain saturation phenomenon is that the material gain g decreases as the optical power density increases.

For a continuous wave, and to a first approximation: $g = g_0/(1+P/P_s)$, where $g_0$ is the unsaturated gain coefficient (or peak value) and $P_s$ is the saturation power of the medium. The coefficient $g_0$ has a value that depends directly on the carrier density at the point concerned and therefore on the electric current density injected at that point.

Accordingly, for a given type of amplifier, increasing length L beyond a certain value leads to a very small relative increase in gain.

To mitigate that limitation, attempts were initially made to increase the saturation power $P_s$ by optimizing the composition of the semiconductor layers constituting the amplifier, for example by adopting complex active structures such as multiple quantum wells.

Flared structure amplifiers have also been proposed in which the amplifier waveguide is flared in the direction of propagation of the amplified wave. The output power can be increased in this way without increasing the average optical power density in the waveguide. That solution increases the gain but is limited by the general need to retain a monomode output wave. What is more, the output wave from an amplifier of the above kind is highly astigmatic which makes it difficult to couple to an optical fiber.

Independently of the previous two approaches, attempts have also been made to maximize the unsaturated gain coefficient $g_0$ by adjusting the pump current injected into the active layer.

Whichever solution is chosen, there remains another problem associated with the shape of the amplified wave. In the case of a monomode wave, for example, the amplitude of its electric field and therefore the optical power density vary along each lateral axis Oy of the waveguide with a maximum at the center of the waveguide. This field distribution is similar to that represented by a Gaussian curve. As shown diagrammatically in FIG. 2, from a particular amplification level the wave E0, E1, E2 then has an amplitude peak near the longitudinal axis Oz of the waveguide and this peak is amplified as it propagates. This reduces the efficiency with which the output wave is coupled to a monomode fiber.

In order to explain the above phenomenon, the reader should recall that a decrease in carrier density is accompanied by increased gain saturation. Since the injection of current is uniform throughout the active waveguide, the Gaussian shape of the wave implies that carrier density is lower at the center than towards the lateral edges, which should lead to a relative reduction of the amplitude at the center of the waveguide. However, the reduction in carrier density also causes an increase in refractive index, the effect of which is to confine the wave towards the longitudinal axis Oz of the waveguide, and it is this effect which predominates. There is therefore a phenomenon whereby the amplified wave is self-focused.

OBJECTS AND SUMMARY OF THE INVENTION

An aim of the invention is to escape from the limitations of the solutions referred to above. To this end it proposes a solution that can greatly increase gain without any self-focusing phenomenon, without any astigmatism of the output wave and in a manner that is compatible with any semiconductor amplifier structure or technology.

To be more precise, the invention consists in a semiconductor optical amplifier including in succession:

an input segment having an input waveguide adapted to guide a monomode input wave, a diffraction segment comprising a first medium transparent to said monomode input wave and adapted to widen it, a collimation segment, and an amplification segment having an amplifier waveguide wider than said input waveguide.

Thus the diffraction segment creates a widened spherical wave, the effect of which is to reduce power density. The role of the collimation segment is then to convert this spherical wave into a plane wave that can be amplified in the wide amplifier waveguide without self-focusing or astigmatism problems.

A first possibility is for the collimation segment to include an optical surface d separating said first medium from a transparent second medium having an effective index lower than that of the first medium.

Another possibility is for the collimation segment to include an optical surface d separating said first medium from a transparent third medium having an effective index higher than that of the first medium.

The latter arrangement is particularly beneficial if the third medium can be that of the amplifier waveguide of the amplification segment because it saves one step of epitaxial growth during fabrication. However, the index of the amplifier waveguide must remain substantially constant. This is the case in particular if the waveguide consists of an active layer with quantum wells because only the latter have an index that is sensitive to the electric current passing through them and, because of their small relative thickness, their influence on the effective index of the amplifier waveguide is negligible.

As the amplifier waveguide usually comprises a thin active wave-guiding layer, the first medium is then advantageously a wave-guiding layer coupled to the active layer and the optical surface will be cylindrical with generator lines perpendicular to the wave-guiding layer.

The invention also consists in a laser oscillator using a semiconductor amplifier as previously defined. To this end it is sufficient to associate reflector means with the amplifier to form a resonant cavity. In a manner that is known in itself, the reflector means can be the cleaved facets of the component constituting the front and rear faces of the amplifier, distributed Bragg reflectors (DBR) or a distributed feedback (DFB) reflector.

In addition to the absence of self-focusing, an oscillator of the above type has the advantage of preventing the occurrence of non-fundamental modes, even if the width of the amplifier waveguide would normally be sufficient to support them. To this end it is sufficient for the input waveguide to be sized for monomode operation and to be of sufficient length to constitute a mode filter.

Another approach is to separate the amplifier function from the oscillator function, in which case the invention also consists in an integrated laser source including a semiconductor optical amplifier as previously defined and wherein said input waveguide comprises an amplifier medium associated with reflector means to form a resonant cavity of a laser oscillator.

The function of the input waveguide is therefore to produce the narrow fundamental mode of a laser wave. This mode is then widened and then amplified by the amplifier. Because of the collimation segment it is possible to obtain a mode width that is much greater than that produced by a narrow monomode waveguide. Thus the power density in the amplification segment can be low, which authorizes high output power but which avoids the problems associated with saturation.

Compared to a laser source using a narrow monomode waveguide oscillator coupled to a flared waveguide amplifier, this solution widens the output wave more and maintains it as a monomode wave. What is more, the absence of the flared waveguide prevents the wave having high astigmatism, which would otherwise make it difficult to couple it to an optical fiber.

BRIEF DESCRIPTION OF THE DRAWINGS

Other aspects and advantages of the invention become apparent in the remainder of the description given with reference to the figures.

FIG. 1 is a diagrammatic perspective view of an example of a semiconductor optical amplifier.

FIG. 2 is a top view of a flared amplifier waveguide.

FIG. 3 is a top view of a first embodiment of an amplifier in accordance with the invention.

FIG. 4 is a view in section on the vertical plane through the longitudinal axis of the amplifier from FIG. 3.

FIG. 5 is a view in section on a transverse vertical plane of the amplifier from FIG. 3.

FIG. 6 is a diagram used to explain how to determine the shape of the optical surface of the first embodiment.

FIG. 7 is a top view of a second embodiment of an amplifier in accordance with the invention.

FIG. 8 is a view of the amplifier from FIG. 7 in section on the vertical plane through the longitudinal axis.

FIG. 9 is a view of the amplifier from FIG. 7 in section on a transverse vertical plane.

FIG. 10 is a diagram used to explain how to determine the shape of the optical surface of the second embodiment.

FIG. 11 is a top view of an integrated laser source in accordance with the invention.

FIG. 12 is a view of the laser source from FIG. 11 in section on the vertical plane through the longitudinal axis.

MORE DETAILED DESCRIPTION

The example of a semiconductor optical amplifier structure shown in FIG. 1 has already been described for the most part in the above introduction. In a fashion that is not limiting on the invention, a structure of the above kind can be used to produce the amplification segments of the amplifier and of the laser source in accordance with the invention. Here the structure is a gain waveguide structure: the width of the waveguide GA is defined by the width of the conductive central part of the top electrode EH. Thus a monomode input optical wave E directed towards the front face of the amplifier will propagate and remain confined within the waveguide and centered on the longitudinal axis Oz through its center O.

A first embodiment of an amplifier in accordance with the invention is shown in FIGS. 3 to 5. Here the amplifier is shown in the form of an individual integrated component but the same structure could be used to make a more complex component.

FIG. 3 is a top view showing the various waveguide areas of the component. FIG. 4 is a section in the vertical plane AA' through the longitudinal axis Oz of the component and shows its vertical structure.

The amplifier comprises an input segment SE, a diffraction segment SD, a collimation segment SC and an amplification segment SA.

The input segment SE includes a narrow input waveguide GE consisting of a medium 5. The diffraction segment SD with effective index n1 is coupled on one side to the input segment SE and on the other side to the amplification segment SA via the collimation segment SC. The waveguide medium of the diffraction segment SD has the same composition as that of the input waveguide GE. The common medium 5 is shaded with dots in the figures.

The collimation segment SC essentially comprises an optical surface d that constitutes the boundary between the medium 5 and a medium 3' which has an effective index n2 lower than the effective index n1 of the diffraction segment SD.

The amplification segment SA is coupled on one side to the collimation segment SC, its opposite side constituting the rear face of the component, through which the amplified wave is emitted. The waveguide medium of the amplification segment SA consists of the active layer CA with effective index n3.

The vertical structure of the amplification segment SA shown in FIG. 4 consists in succession from the bottom towards the top of a bottom electrode EB, a substrate 1, a bottom buffer layer 2, an active layer CA, a top buffer layer 3 and a top electrode EH. The electrode EH comprises a contact layer 4 onto which metal layers 6, 7 are deposited. The active layer CA extends the entire width of the component and the amplifier waveguide GA is defined by localized etching of the contact layer 4 to leave only a conductive strip corresponding to the width of the waveguide.

The structures of the input segment SE and the diffraction segment SD are similar except that the active layer is replaced by a non-amplifying wave-guiding layer 5 that is transparent at the wavelengths used. Its index is higher than the indices of the media surrounding it. Also, the input waveguide GE is of the buried type and its width is made sufficiently small to impose a fundamental mode at the wavelengths used.

The medium 3' of the collimation segment SC has an index lower than that of the layer 5. It can have the same composition as the substrate 1.

FIG. 5 is a sectional view on a transverse vertical plane BB' intersecting the optical surface d.

Because the wave-guiding layers are generally very thin compared to the horizontal dimensions of the propagated wave, the optical surface is in practice inscribed in a cylindrical surface with vertical generator lines. The director curve of the cylinder therefore defines the optical surface.

FIG. 6 explains how to determine that curve. In the figure, F represents the entry point of the diffraction segment SD and P is a point of intersection of the optical surface d and the vertical plane AA'. The curve required therefore consists of the set of points M such that:

n1.FM+n2.MM'=n1.FP, where M' is the projection of M onto the transverse vertical plane through P.

Introducing polar co-ordinates r=FM and θ equal to the angle between FM and FP, and setting FP=p:

n1.(p−r)=n2.(p−r.cos θ)

n1 being greater than n2, the above equation is that of an ellipse with focus F that depends only on the parameters n1, n2 and FP. Accordingly, knowing n1 and n2 and setting a required width of the amplifier waveguide GA, it is possible to find at least one suitable value of FP and to calculate the exact shape of the corresponding optical surface.

The component can be fabricated on a III–V element substrate and by way of non-limiting example an indium phosphide InP substrate has been chosen.

Forming on the substrate 1 the layers 2, CA, 5, 3, 3' and 4 requires well-known epitaxial techniques, for example the molecular beam epitaxy (MBE) process.

The optical surface is made using the butt-coupling technique which is known in itself and is widely used in the fabrication of integrated laser modulators (ILM). This technique is described in European Patent EP-A-664568, published Jul. 26, 1995 and corresponding to U.S. Pat. No. 5,646,064, published Jul. 8, 1997, for example. The butt-coupling technique can be used to form semiconductor layers with any composition and shape accurately disposed in selected horizontal planes, so that the layers can be well coupled to each other, for example.

The above technique can therefore be used to make the optical surface d by localized formation of the layers 5 and 3' using a mask the design of which reproduces the curve defined above.

The electrode EH can be fabricated in the following manner. After forming an InGaAs ternary contact layer 4 over of all of the surface of the component, a metal layer 6 is deposited directly onto all of the surface of the contact layer 4. The metal layer 6 is a layer of tungsten, for example. The deposition technique can be a vacuum evaporation process known in itself.

A resin mask is then formed using a conventional photolithographic process. The shape of the mask defines the conductive area of the electrode EH and thus the width of the amplifier waveguide GA.

The layers 6 and 4 are then etched in succession through the above mask. In the case of tungsten, the reactive ion etching (RIE) technique known in itself can be used, employing tungsten hexafluoride. The reactive ion etching process can also be used for the contact layer 4, employing methane and hydrogen for InGaAs.

The resin is then removed and annealing (at 550° C. in the case of InP) reduces the resistivity at the boundary between the contact layer 4 and the metallic layer 6.

A metallization layer 7 is then deposited over all of the surface of the component, consisting for example of a succession of layers of titanium, platinum and gold. As with the metal layer 6 the deposits can be obtained by vacuum evaporation processes.

As the waveguide structure is not buried (gain guidance), ion implantation (using hydrogen ions) localized to the lateral edges of the component is then carried out through the metallization layer.

For an operating wavelength of 1.48 mm, for example, the dimensional characteristics can be as follows:

doped InP substrate 1 ($2.10^{18}$ electrons per $cm^3$) 10 mm thick;

bottom buffer layer 2 having the same composition and doping as the substrate, approximately 0.5 mm thick;

undoped InGaAsP quaternary alloy wave-guiding layer 5 of the input waveguide GE and the diffraction segment SD having an effective index n1=3.25, 40 nm thick: the composition of the alloy is chosen to have a characteristic wavelength (gap wavelength) equal to 1.10 mm;

medium 3' having the same composition and doping as the substrate, effective index n2=3.18;

active layer CA with effective index n3=3.40, including:
   an n-doped InGaAsP quaternary bottom confinement layer the composition of which is chosen to have a characteristic wavelength equal to 1.18 mm, 40 nm thick,
   a strained quantum well structure made up of four wells and three undoped InGaAsP quaternary barriers; composition of wells: $In_{0.8}$ $Ga_{0.2}$ $As_{0.73}$ $P_{0.27}$, composition of barriers: $In_{0.8}$ $Ga_{0.2}$ $As_{0.44}$ $P_{0.56}$,
   a p-doped InGaAsP quaternary top confinement layer the composition of which is chosen to have a characteristic wavelength equal to 1.18 mm, 40 nm thick;

a top buffer layer 3 consisting of p-doped InP ($2.10^{18}$ holes per $cm^3$), approximately 3 mm thick;

strongly p-doped InGaAs ternary contact layer 4 ($2.10^{19}$ holes per $cm^3$), approximately 0.3 mm thick;

0.1 mm thick tungsten layer 6;

0.4 mm thick metallization layer 7;

length of input waveguide GE: at least 300 mm;

width of input waveguide GE: 3 mm;

length of diffraction segment SD: 1 mm;

length of collimation segment SC: 150 mm;

length of amplifier waveguide GA: 1 mm;

width of optical surface and amplifier waveguide GA: 150 mm;

width of component: 600 mm.

FIGS. 7 through 9 show a second embodiment of the amplifier in accordance with the invention. As before it has the input segment SE, the diffraction segment SD, the collimation segment SC and the amplification segment SA.

This embodiment differs from the previous one in that the collimation segment SC is formed by a direct junction between the diffraction segment SD and the amplification segment SA. The optical surface d is then the surface between the medium 5 and the active layer CA. Because the active layer CA has an effective index n3 higher than the index n1 of the layer 5, the concavity of the optical surface d is reversed relative to that of the previous embodiment.

The vertical structure of the component is shown in FIG. 8 which is a section in the vertical plane CC' through the longitudinal axis Oz. The layers already described above are included here, except for the layer 3'. Also, the top electrode that defines the dimensions of the amplifier waveguide GA covers all of the optical surface d. It can even project over the layer 5 because it is a passive medium whose effective index n1 is not influenced by the current flowing through it.

To complete the description, FIG. 9 shows a section in the transverse vertical plane DD' in the collimation segment SC. The structure of the electrode EH can be seen together with the buried active layer CA delimited laterally by the medium 5.

As previously, the FIG. 10 diagram is used to explain the calculation of the director curve of the optical surface. Using the same notation as for FIG. 6, the curve will be defined by the set of points M satisfying the following condition:

n1.FM=n1.FP+n3.PM", where M" is the projection of M onto the longitudinal vertical plane passing through P.

Using polar co-ordinates:

n1.(r−p)=n3.(r.cos θ−p)

n3 being greater than n1, the above equation is that of a hyperbola with focus F that depends only on the parameters n1, n3 and FP. As previously, knowing n1 and n3 and fixing a required width of the amplifier waveguide GA, it is possible to find at least one suitable value of FP and to calculate the exact shape of the corresponding optical surface.

To make a laser oscillator for either embodiment just described it is sufficient to associate with it reflector means for constituting a resonant cavity containing the four segments previously described. The above means comprise cleaved facets constituting the front and rear faces of the component, for example. Alternatively, the resonant cavity can be obtained using other types of reflector such as a Bragg grating to produce a distributed feedback (DFB) laser oscillator or distributed Bragg reflectors (DBR) or external reflectors.

FIGS. 11 and 12 show one embodiment of an integrated laser source in accordance with the invention. FIG. 11 is a top view and FIG. 12 is a view in section on the vertical plane AA' passing through the longitudinal axis Oz of the component.

As in the amplifier from FIGS. 3 and 4, there are the input segment SE, diffraction segment SD, collimation segment SC and amplification segment SA. The segments SD, SC and SA are identical to those of the amplifier. On the other hand, the input segment SE has a top electrode EH' and an input waveguide GE formed in an amplifying medium CA'. The waveguide GE is associated with reflector means 8. In the example shown the above means comprise a Bragg grating to produce a distributed feedback (DFB) laser oscillator. The top electrode EH' is sized to constitute a narrow amplifier waveguide GE. The active layer CA' has the same composition as the layer CA.

As an alternative to this, the resonant cavity can be produced using other types of reflectors such as the cleaved facet of the component constituting its front face, an external reflector and/or distributed Bragg reflectors (DBR).

The length of the input waveguide GE is 1 mm, for example.

Of course the integrated laser source can also be made with the structure of the segments SD, SC and sa of the amplifier from FIGS. 7 and 8.

What is claimed is:

1. A semiconductor optical amplifier including in succession:
   an input segment having an input waveguide adapted to guide a monomode input wave,
   a diffraction segment comprising a first medium transparent to said monomode input wave and adapted to widen it,
   a collimation segment, and
   an amplification segment having an amplifier waveguide wider than said input waveguide.

2. An amplifier according to claim 1, wherein said collimation segment comprises an optical surface d separating said first medium from a transparent second medium having an effective index lower than that of the first medium.

3. An amplifier according to claim 1, wherein said collimation segment includes an optical surface d separating said first medium from a transparent third medium having an effective index higher than that of the first medium.

4. An amplifier according to claim 3, wherein said third medium is that which constitutes the amplifier waveguide of said amplification segment.

5. An amplifier according to claim 1, wherein said amplifier comprises a thin active layer, said first medium consists of a wave-guiding layer coupled to said active layer and said optical surface d has a cylindrical surface with generator lines perpendicular to said wave-guiding layer.

6. A laser oscillator comprising a semiconductor optical amplifier according to claim 1 and reflector means to form a resonant cavity.

7. A semiconductor integrated laser source including a semiconductor optical amplifier according to claim 1, and wherein said input waveguide comprises an amplifier medium associated with reflector means to form a resonant cavity of a laser oscillator.

* * * * *

UNITED STATES PATENT AND TRADEMARK OFFICE
CERTIFICATE OF CORRECTION

PATENT NO. : 6,137,625
DATED : October 24, 2000
INVENTOR(S) : Paul salet, et. al.

It is certified that error appears in the above-identified patent and that said Letters Patent is hereby corrected as shown below:

The title should read as follows: --SEMICONDUCTOR OPTICAL AMPLIFIER AND INTEGRATED LASER SOURCE INCORPORATING IT Signed and Sealed this Twenty-second Day of May, 2001

*Attest:*

NICHOLAS P. GODICI

*Attesting Officer*   Acting Director of the United States Patent and Trademark Office